US011384789B2

(12) United States Patent
Rey et al.

(10) Patent No.: US 11,384,789 B2
(45) Date of Patent: Jul. 12, 2022

(54) OUT-OF-PLANE HINGE FOR A MICROMECHANICAL AND/OR NANOMECHANICAL STRUCTURE WITH A REDUCED SENSITIVITY TO INTERNAL STRESSES

(71) Applicant: COMMISSARIAT A L'ENERGIE ATOMIQUE ET AUX ENERGIES ALTERNATIVES, Paris (FR)

(72) Inventors: Patrice Rey, Grenoble (FR); Loic Joet, Grenoble (FR); Thierry Verdot, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 221 days.

(21) Appl. No.: 16/840,540

(22) Filed: Apr. 6, 2020

(65) Prior Publication Data
US 2020/0318677 A1    Oct. 8, 2020

(30) Foreign Application Priority Data
Apr. 8, 2019    (FR) .................................... 19 03730

(51) Int. Cl.
*G01L 1/18*    (2006.01)
*F16C 11/12*   (2006.01)
*B81B 3/00*    (2006.01)

(52) U.S. Cl.
CPC ............ *F16C 11/12* (2013.01); *B81B 3/0051* (2013.01); *G01L 1/183* (2013.01)

(58) Field of Classification Search
CPC ................... F16C 11/12; B81B 3/0051; B81B 2203/0154; B81B 2203/0163; G01L 1/183
See application file for complete search history.

(56) References Cited

U.S. PATENT DOCUMENTS 6,392,220 B1 *   5/2002   Slater ................. H04Q 11/0005
                                                       250/216
10,247,753 B2 *  4/2019   Geisberger ............ G01P 15/125
(Continued)

FOREIGN PATENT DOCUMENTS

EP    2 211 185 A1    7/2010
FR    2 983 844 A1    6/2013

OTHER PUBLICATIONS

French Preliminary Search Report dated Jan. 14, 2020 in French Application 19 03730 filed on Apr. 8, 2019 (with English Translation of Categories of Cited Documents), citing documents AA & AO therein, 2 pages.
(Continued)

*Primary Examiner* — David J Bolduc
(74) *Attorney, Agent, or Firm* — Oblon, McClelland, Maier & Neustadt, L.L.P.

(57) ABSTRACT

A hinge between a support and a movable part in an out-of-plane direction of a microelectromechanical structure includes two torsion beams, and two bending elements connecting the movable part and the support and each comprising two beams extending perpendicularly to the axis of rotation. Each beam is connected to the support by a first end and to the movable part by a second end, the first ends and the second ends of the beams being disposed with respect to one another in such a way that the orientation of the first end towards the second end of one beam is opposite to the orientation of the first end towards the second end of the other beam.

16 Claims, 4 Drawing Sheets

(56) References Cited

U.S. PATENT DOCUMENTS

| | | | | |
|---|---|---|---|---|
| 2002/0092352 | A1* | 7/2002 | Foote | G01P 15/097 73/514.21 |
| 2008/0314148 | A1* | 12/2008 | Robert | B81B 3/0086 73/514.33 |
| 2011/0147860 | A1* | 6/2011 | Robert | B81B 3/0051 257/415 |
| 2011/0219875 | A1* | 9/2011 | Walther | B81B 3/0051 73/514.29 |
| 2014/0300942 | A1 | 10/2014 | Van Lierop et al. | |
| 2014/0331770 | A1* | 11/2014 | Jourdan | B81B 3/00 73/514.01 |
| 2014/0338450 | A1* | 11/2014 | Classen | G01P 15/125 73/514.32 |
| 2015/0355221 | A1* | 12/2015 | Robert | G01P 15/123 73/514.29 |
| 2016/0258825 | A1* | 9/2016 | Gurin | G01L 1/2293 |
| 2017/0363493 | A1* | 12/2017 | Fain | H04R 1/38 |
| 2019/0234990 | A1* | 8/2019 | Kihara | B81B 3/0051 |

OTHER PUBLICATIONS

U.S. Appl. No. 15/248,756, filed Aug. 26, 2016, 2017/0059420 A1, Rey, P, et al.
U.S. Appl. No. 15/625,314, filed Jun. 16, 2017, 2017/0363424 A1, Maspero, F, et al.
U.S. Appl. No. 16/064,123, filed Jun. 20, 2018, 2019/0011260 A1, Onfroy, P, et al.
U.S. Appl. No. 16/331,264, filed Mar. 7, 2019, 2019/0218643 A1, Pellet-Rostaing, S, et al.
U.S. Appl. No. 16/348,004, filed May 7, 2019, Joet, L, et al.
U.S. Appl. No. 16/466,432, filed Jun. 4, 2019, 2019/0308873 A1, Joet, L.
U.S. Appl. No. 16/590,015, filed Oct. 1, 2019, 2020/0102211 A1 Joet, L, et al.
U.S. Appl. No. 16/716,632, filed Dec. 17, 2019, Dagher, S, et al.
U.S. Appl. No. 16/721,578, filed Dec. 19, 2019, Dagher, S, et al.
U.S. Appl. No. 16/717,866, filed Dec. 17, 2019, Hilt, T, et al.

* cited by examiner

OUT-OF-PLANE HINGE FOR A MICROMECHANICAL AND/OR NANOMECHANICAL STRUCTURE WITH A REDUCED SENSITIVITY TO INTERNAL STRESSES

TECHNICAL FIELD AND PRIOR ART

The present invention relates to an out-of-plane hinge for a micro and/or nanomechanical structure, in particular for a microelectromechanical system, offering a reduced sensitivity to internal stresses.

Microelectromechanical systems or MEMS and micro and nanoelectromechanical systems or M&NEMS systems are used to make sensors or actuators. They comprise at least one element that is movable in relation to a substrate. For example in the case of a sensor, the displacement of the movable part or mass is measured and can be transduced into a characteristic to be detected, for example an acceleration, and in the case of an actuator, the movable element is displaced for example by means of electrostatic forces, for example for displacing a micromirror.

The movable element is suspended with respect to the substrate and according to the applications it may be desired that it have a displacement in the plane on the system or an out-of-plane displacement, i.e. orthogonally to the plane of the system.

FIG. 1 shows an example of a microelectromechanical structure of the prior art.

The structure extending in the plane XY, comprises a mass 1000 able to be displaced in an out-of-plane direction Z with respect to a support 1002. The structure comprises a hinge 1004 forming an articulation in rotation 1004 between the support 1002 and the mass 1000, the hinge having an axis of rotation Y1 in the plane. The hinge connects an edge of the mass to the support, and comprises two beams 1006 intended to be solicited in torsion and coaxial to the axis of rotation and two beams 1008 intended to be solicited in bending and orthogonal to the axis of rotation. The beams 1006 and 1008 connect the mass to the support. This structure also comprises two piezoresistive gauges 1010 that make it possible to measure the displacement of the mass. The bending beams 1008 have for function to rigidify the articulation in the direction X. However they also cause a rigidification of the articulation in the out-of-plane direction, which is not desirable. In order to reduce the effect thereof on the rigidity in the direction Z, the thickness of the bending beams is reduced.

Such a structure is produced by the methods of microelectronics that implement depositions, etchings and a release of the mass. For example the structure is made by etching in a layer formed by epitaxy on a Silicon on Insulator (SOI) substrate and the mass is released by etching the buried oxide layer of the SOI substrate.

During the making of the layer via epitaxy, stresses are generated in the layer. These stresses can in particular by due to doping. For example, the boron atoms are smaller than those of silicon and induce a stress in compression in the crystalline cell of the silicon. This stress can also appear before the epitaxy, during the doping of the thin layer of the SOI substrate. During the release of the structure by etching, these stresses in all the layers are at least partially released. However this releasing of the stresses generates a new balance of the forces and moments that can lead to a deformation of the structure. The bending beams are formed in the epitaxied layer. During the release of the structure, the stresses in the beams expand/retract. However the gauges, which are parallel to the bending beams, oppose the expansion/retraction of the bending beams. As the bending beams and the gauges are in different planes, the mass tilts. It is then no longer perpendicular to the axis Z. When the internal stresses come from the thin layer of the SOI substrate, as the gauges 1010 are not aligned, they will induce a torque on the mass and cause it to turn in the plane. In addition, the internal stresses of the lower layer of the bending beams cause them to bend, causing an inclination of the mass.

A deformation of the structure can also occur during the release of stresses in the SOI substrate.

The stress can also result from the thermal expansion. Two layers that do not have the same expansion coefficient expand differently and result in stresses at the junctions thereof.

However this inclination and more generally a deformation of the structure have several disadvantages. On the one hand, it induces a stress in the gauges, which may not be negligible with respect to the stress on a full measuring scale, which has the effect of reducing the range of variation of the stress or can then cause an exceeding of the maximum permissible stress.

On the other hand, a microelectromechanical structure can comprise top and bottom abutments in order to limit the out-of-plane travel of the mass, so as to prevent the exceeding of the permissible stresses. When the mass is not tilted, it is at rest at an equal distance from the top and bottom abutments. However in case of inclination of the mass, the distances between the mass and the top and bottom abutments are different. If the mass is tilted towards the support, the distance between the mass and the bottom abutment is less than that between the mass and the top abutment. If the inclination of the mass is known, the abutments could be adapted to offset this difference in distance, however such an adaptation complicates the method of production. Furthermore it is difficult to predict the inclination of the mass.

The deformation of the structure can also occur in the absence of stress gauges.

Generally, it is desired that the effect of the internal stresses on the structure be reduced.

DISCLOSURE OF THE INVENTION

It is consequently a purpose of the present application to offer an out-of-plane hinge for a micro and/or nanomechanical structure with a reduced sensitivity to internal stresses.

The purpose mentioned hereinabove is achieved by an out-of-plane hinge for a micro and/or nanomechanical structure that comprises a support, at least one movable part in an out-of-plane direction with respect to the support, said hinge being intended to connect the movable part and the support so as to allow for an out-of-plane displacement of the movable part, said hinge forming an articulation in rotation comprising at least one element configured to be deformed in torsion and aligned along the axis of rotation of the articulation, and at least one element configured to be deformed in bending and extending perpendicularly to the axis of rotation of the articulation. Said bending element is intended to mechanically connect the movable part and the support and comprises at least two bending beams arranged one with respect to the other and with respect to the support and to the movable part in such a way that the action of each beam along a direction orthogonal to the axis of rotation on the movable part opposes the action of the other beam on the movable part along the direction orthogonal to the axis of rotation and cancels it at least partially, and preferably completely.

The hinge described in this application makes it possible to offset the effect of the internal stresses released along the direction in the plane orthogonal to the axis of rotation, which are the stresses that have the most hindering action on the structure. The internal stresses in the direction of the axis of rotation can be released and the stresses in the out-of-plane direction are added together. But the contributions thereof to the deformation of the structure are low relatively to those of the stresses along the direction in the plane orthogonal to the axis of rotation.

Thus the rest position of the movable part with respect to the top and bottom abutments is practically centred, even centred.

In the case of a structure that implements stress gauges, in the rest position of the movable part, the gauges are hardly stressed, even are not stressed.

In other terms, a pivot articulation is carried out that comprises at least one bending element comprising bending beams combined such that a self-compensation of the internal stresses takes place within the bending element, limiting the effect of the internal stresses on the structure.

Advantageously, the hinge comprises two bending elements.

In an embodiment, the structure is implemented in a microelectronic system and comprises means of detection for example comprising one or more stress gauges. According to an advantageous characteristic, the means of detection comprise two gauges disposed with respect to one another in such a way as to limit the effect, on the structure, of the internal stresses of the layer wherein they are produced.

In an advantageous example, the structure comprises torsion elements such that they also limit the effect of the internal stresses of the torsion beams on the structure.

One subject-matter of the present application is a hinge for a micromechanical and/or nanomechanical structure comprising a support, at least one movable part in an out-of-plane direction with respect to the support, said hinge being intended to suspend the movable part from the support allowing for the out-of-plane displacement of the movable part, the hinge comprising at least one torsion element comprising at least one beam aligned with or parallel to the axis of rotation of the hinge, and configured to be deformed in torsion, at least one bending element configured to be deformed in bending, said bending element being intended to mechanically connect the movable part and the support and comprising at least one first bending beam and at least one second bending beam extending perpendicularly to the axis of rotation of the hinge, the first bending beam being intended to be mechanically connected directly to the support by a first end and to the movable part by a second end, and the second bending beam being intended to be mechanically connected directly to the support by a first end and to the movable part by a second end, the first end and the second end of the first bending beam and the first end and the second end of the second bending beam being disposed with respect to one another in such a way that the orientation of the first end towards the second end of the first bending beam is opposed to the orientation of the first end towards the second end of the second bending beam.

Preferably, the at least first and second bending beams have the same dimensions.

In an advantageous example, the hinge comprises two bending elements. For example, the bending elements are disposed on either side of the at least one torsion element.

In an advantageous example, the hinge comprises two torsion elements each comprising a torsion beam aligned with the axis of rotation.

According to an additional characteristic, the torsion element comprises a first torsion beam and a second torsion beam, and said torsion beam forms the first torsion beam, the first and second torsion beams being parallel to one another, and connected together by at least one of the longitudinal ends thereof, one of the torsion beams being intended to be mechanically connected directly to the movable part and the other torsion beam being intended to be mechanically connected directed to the support. In an advantageous example, the hinge comprises two pairs of torsion beams aligned relative to each other along the axis of rotation.

For example, the hinge is made from a stack of layers and from etching steps, wherein at least the first and second bending beams are made in the same layer.

Another subject-matter of the present application is a micromechanical and/or nanomechanical structure comprising a support, a movable part in the out-of-plane direction and a hinge according to the invention connecting the movable part to the support.

The structure can comprise means of out-of-plane abutment for the mass moving away from and/or moving towards the support.

Another subject-matter of the present application is a microelectronic system comprising at least one structure according to the invention.

The microelectronic system can advantageously comprise means for detecting the out-of-plane displacement of the movable part, comprising at least one first stress gauge, the first stress gauge being mechanically connected directly to the support by a first end and to the movable part by a second end.

For example, the means for detecting the out-of-plane displacement of the movable part also comprise a second stress gauge, the second stress gauge being mechanically connected directly to the support by a first end and to the movable part by a second end, the first end and the second end of the first stress gauge and the first end and the second end of the second stress gauge being disposed with respect to one another in such a way that the orientation of the first end towards the second end of the first stress gauge is opposed to the orientation of the first end towards the second end of the second stress gauge.

BRIEF DESCRIPTION OF THE DRAWINGS

The present invention shall be better understood based on the following description and the accompanying drawings wherein.

DETAILED DISCLOSURE OF PARTICULAR EMBODIMENTS

This invention relates to hinges for micromechanical and/or nanomechanical structures, in particular implemented in MEMS and/or NEMS systems applied for example to accelerometers, gyrometers, gas sensors, actuators, etc. In the following description the structure shall be designated as MEMS structure.

Figure 1:
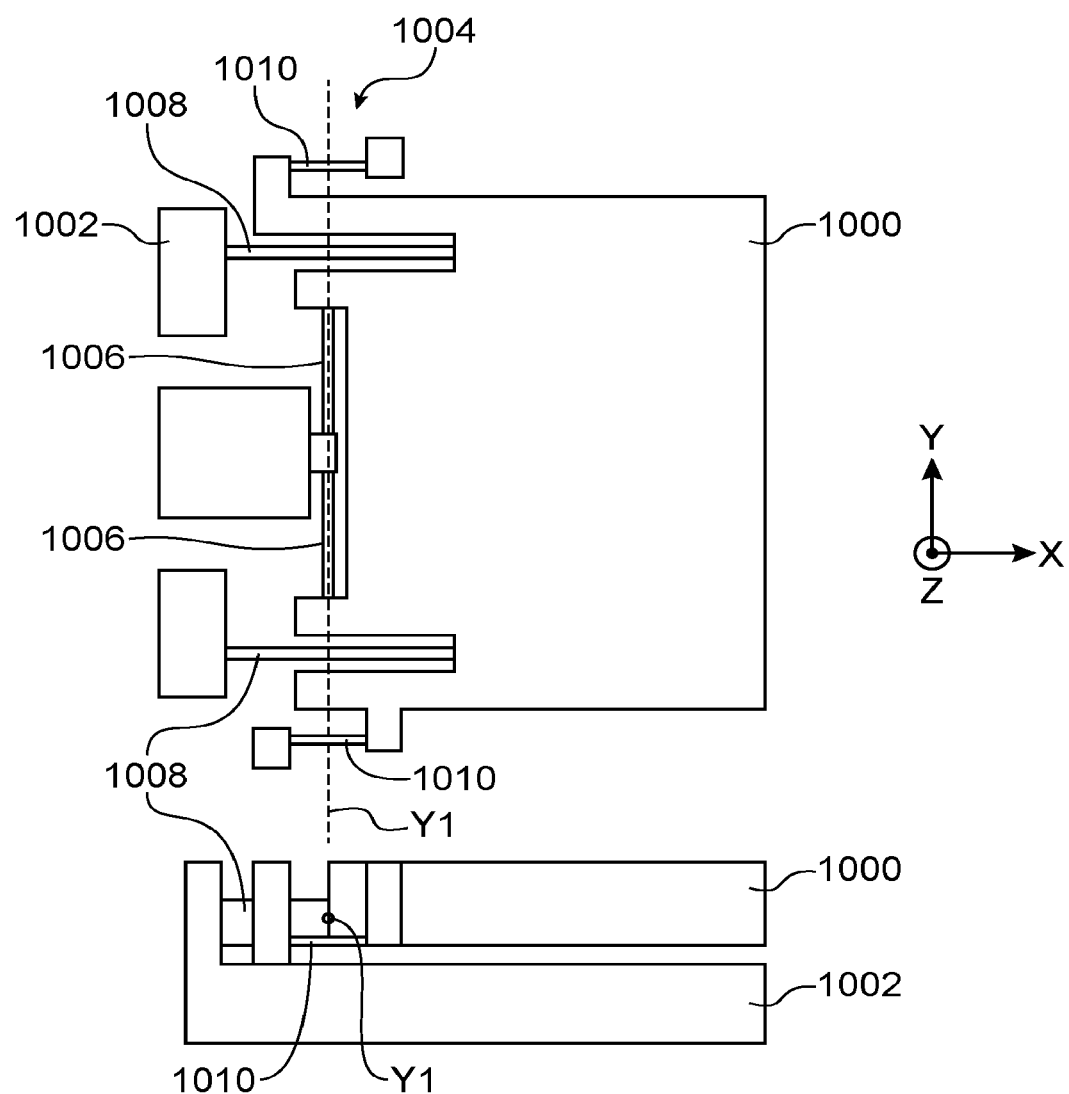
FIG. 1 is a top and side view of a MEMS structure of the prior art.
Figure 2:
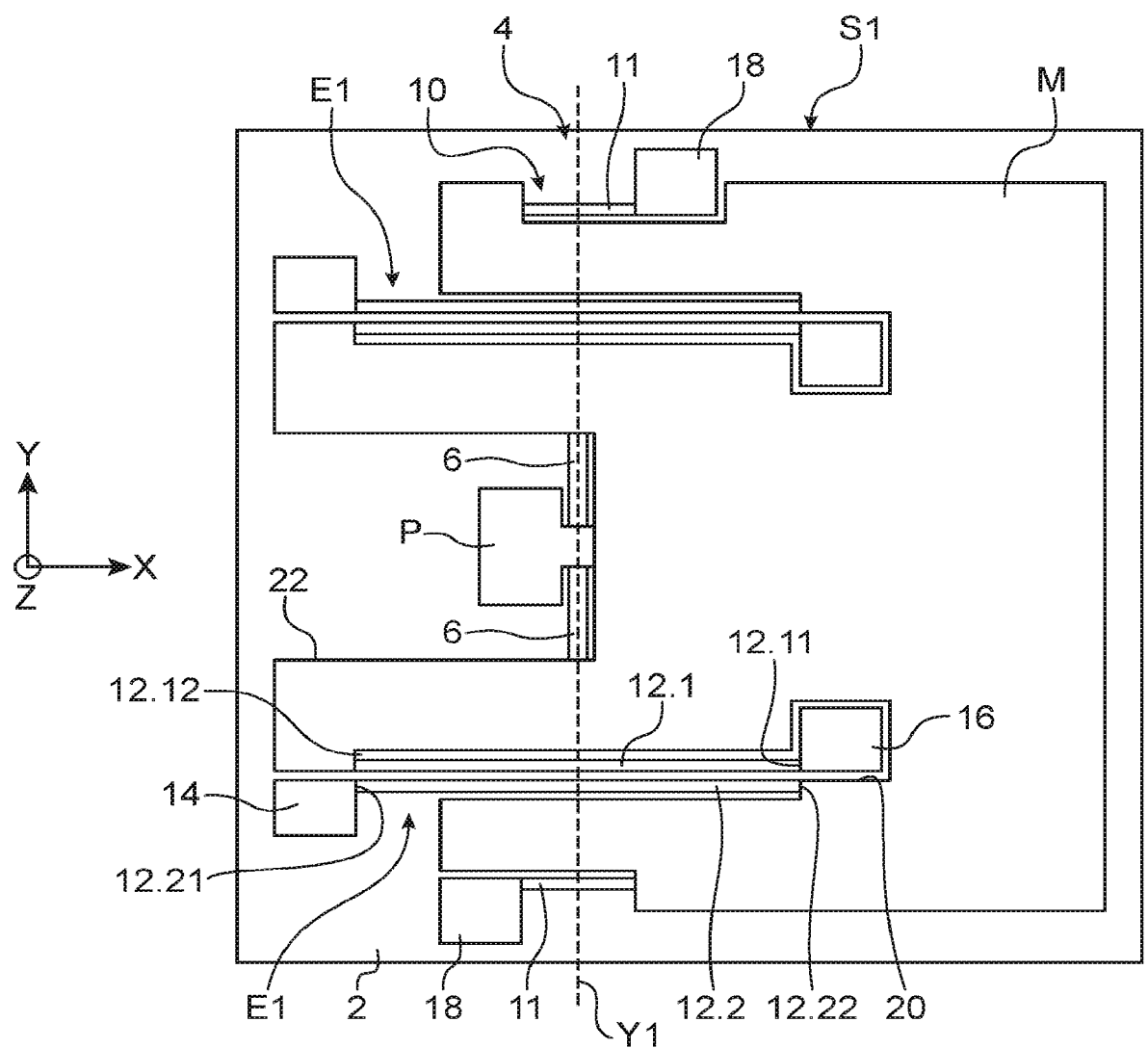
FIG. 2 is a top view of a MEMS structure according to a first embodiment.

FIG. 2 diagrammatically shows a MEMS structure comprising an example of a hinge according to a first embodiment.

The MEMS structure S1 comprises a movable part M suspended from a support 2 by means of a hinge 4 forming a pivot articulation 4.

For example, the movable part M can be a inertial mass in the case of an accelerometer, or a micromirror or a platform that can be oriented in the case of an actuator.

The movable part M extends in the plane of the structure defined by the axes X and Y. The plane of the structure is the mean plane of the structure that corresponds to the plane of the sheet as shown in FIG. 2.

The suspended portion is intended to be displaced in an out-of-plane direction Z, orthogonal to the axes X and Y.

The hinge has an axis Y1 parallel to the axis Y.

The hinge 4 is connected to an edge of the suspended part M.

In the example shown, the hinge 4 comprises two beams 6 that extend along the axis Y1 and intended to be solicited in torsion during the displacement of the movable mass in the out-of-plane direction. Each torsion beam 6 is connected by a longitudinal end to an anchoring stud P of the support, and by another longitudinal end to the movable part M.

The hinge also comprises two elements E1 that extend perpendicularly to the axis Y1 between the movable part M and the support 2. The elements E1 are intended to be solicited in bending and shall be designated in what follows as "bending elements".

The two elements E1 have similar structures, only one of these elements will be described in detail.

The bending element E1 comprises a pair of first and second beams 12.1, 12.2 parallel with each other and perpendicular to the axis Y1. In this example, the axis Y1 passes through the middle of the first and second beams.

Each beam 12.1, 12.2 is connected by a first longitudinal end 12.11, 12.21 to an anchoring stud 14, 16 of the support respectively, and by a second end 12.12, 12.22 to the movable part M. The beams are disposed head to toe, i.e. the first end 12.11 of the first beam and the first end 12.21 of the second beam are each disposed on either side of the axis of rotation Y1, as well as the two ends 12.12 and 12.22.

The stresses internal to each beam 12.1, 12.2, which are released during manufacturing, are exerted between the first end 12.11, 12.21 connected to the support and the end 12.12, 12.22 connected to the movable part.

The head-to-toe arrangement of the beams 12.1, 12.2, and in particular the arrangement of the anchoring thereof to the support, have for consequence that the internal stresses in the direction X in the first beam 12.1 are exerted on the mass in a direction opposite that wherein the internal stresses are exerted in the direction X in the second beam 12.2. Thus the internal stresses in the direction X to the first beam 12.1 have an action on the movable part M opposite to the action exerted by the second beam 12.2. However, since the beams substantially have the same characteristics, i.e. substantially the same dimensions at the margins due to the production method, and are made in the same layer, the internal stresses in the direction X in the two beams are close or equal and are practically entirely or entirely neutralised. The bending element E1 then exerts no or little force on the movable part, it therefore is not deformed under the effect of the relaxing of the internal stresses, or then negligibly.

The MEMS structure S1 also comprises means for measuring 10 the displacement of the movable part. In this example, the means for measuring 10 comprise gauges 11 suspended between the movable part and anchoring studs 18 of the support and are disposed in a plane separate from a plane parallel to the plane XY and containing the axis of rotation Y1. The gauges 11 are disposed in such a way that, when a gauge is solicited in traction, the other is solicited in compression.

The bending beams of each bending elements are mechanically mounted in parallel.

Figure 3:
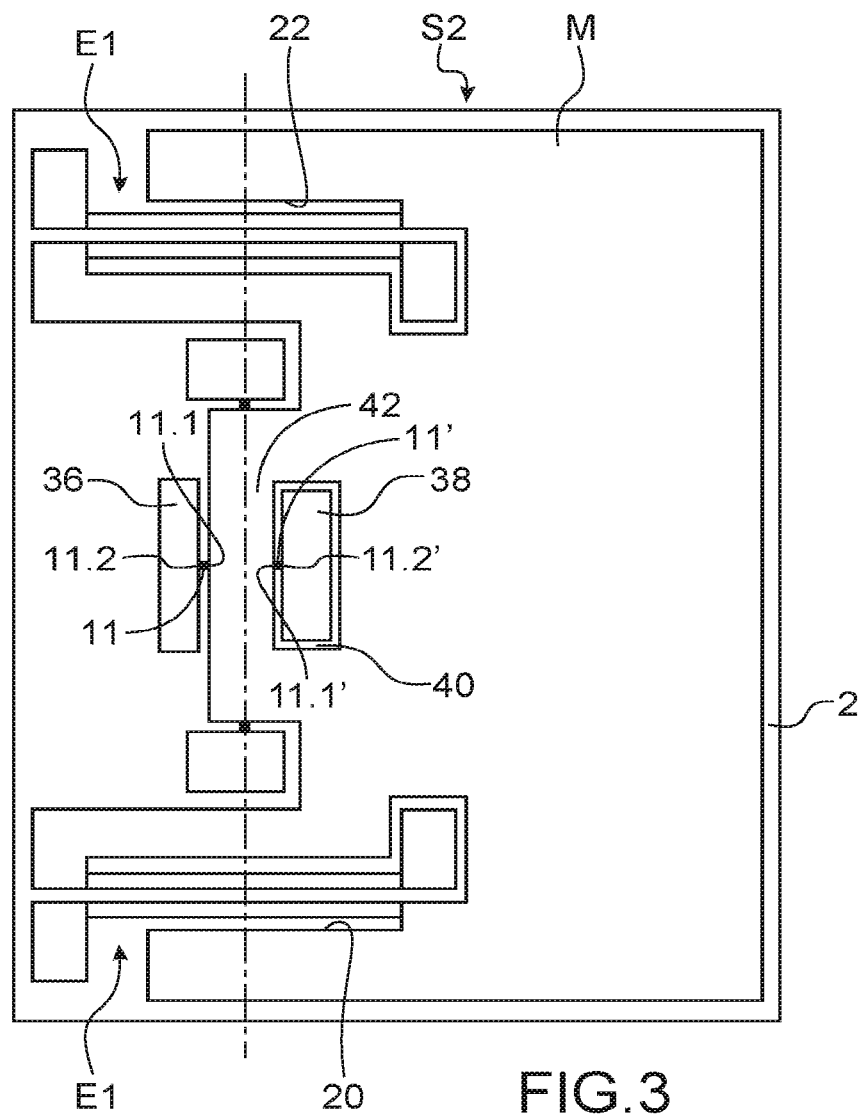
FIG. 3 is a variant embodiment of the structure of FIG. 2.

FIG. 3 shows a variant embodiment S2 of the structure S1, wherein the gauges 11, 11' are disposed in such a way that the internal stresses thereof are offset, limiting the effect of these stresses on the movable part. The bending elements E1 are similar to those of the structure S1.

Indeed a compressive stress can exist in the layer used for the manufacture of the gauges, due to the implantation of dopants, and which is released during the release of the gauges. This stress can participate in the deformation of the structure.

In FIG. 3, the gauges 11, 11' are aligned and are connected to the movable part and to the anchoring studs in such a way that the internal stresses of one gauge oppose the internal stresses of the other gauge.

The gauge 11 has a longitudinal end 11.1 connected to the movable part and a longitudinal end 11.2 connected to the anchoring stud 36. The gauge 11' has a longitudinal end 11.1' connected to the movable part and a longitudinal end 11.2' connected to the anchoring stud 38. The longitudinal ends 11.1 and 11.1' are facing. The anchoring stud 36 is located in a window 40 formed through the movable part, of which a post 42 is used for fastening to the ends 11.1, 11.1' of the gauges.

Each bending element can comprise an assembly of several bending beams, each assembly providing a self-compensation of the stresses internal to the beams thereof. Implementing several beams makes it possible to increase the rigidity on the plane offered by the bending elements.

For example, each bending element can comprise several pairs of bending beams, each pair providing a self-compensation of the stresses internal to the beams thereof. Implementing several beams makes it possible to increase the rigidity on the plane offered by the bending elements.

According to another example, an assembly comprises more than two beams, for example three beams, two beams of a first width offset the stresses of the other beam of a second width equal to twice the first width. It can also be considered to produce the assemblies with several beams of different lengths and provide a self-compensation.

In addition, in the example shown, the movable part is structured in such a way as to integrate the bending elements. The part comprises cut-outs 20 that extend parallel to the axis X and house the anchoring studs and the bending beams and a cut-out 22 that houses the anchoring studs and the torsion beams. This arrangement makes it possible to offer a compact structure.

Figure 4:
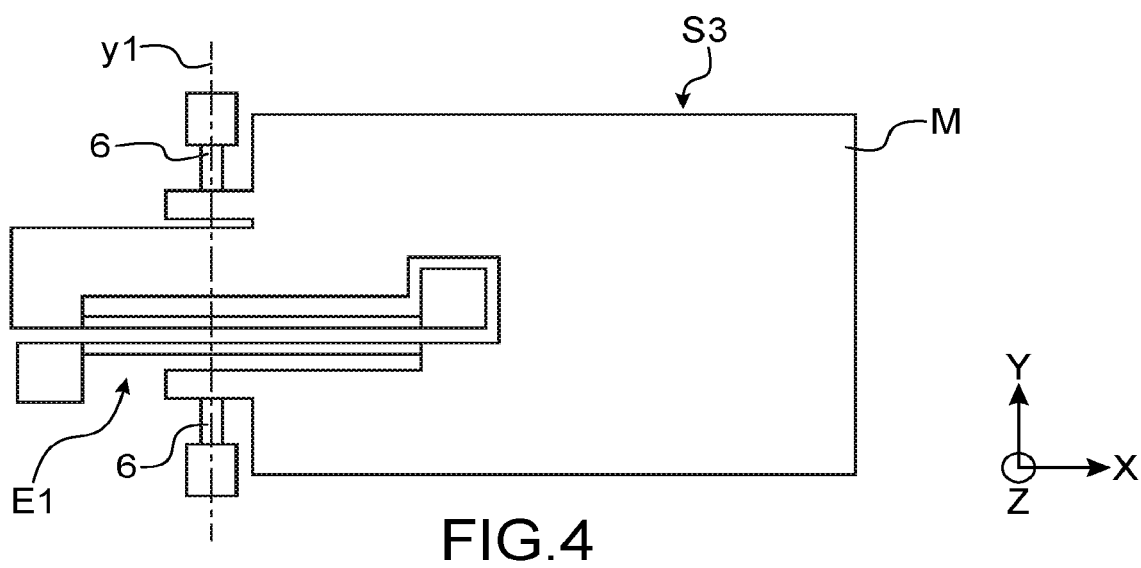
FIG. 4 is a top view of another embodiment of a structure comprising a single bending element.

FIG. 4 shows a structure S3 comprising another example of a hinge according to the first embodiment comprising a single bending element E1. Advantageously, the latter is aligned with an axis of symmetry of the structure, that provides a balancing of the structure. However a hinge comprising a single bending element that would not be aligned with an axis of symmetry of the structure belongs to the scope of the present invention.

The hinge also comprises two torsion beams 6 disposed on either side of the bending elements E1. In this example, the structure does not comprise means for measuring, but it will be understood that they can be arranged for example as in the structure S1 or the structure S5.

A hinge comprising a single bending element and a single torsion beam belongs to the scope of the present invention.

In the examples described, the means for measuring comprise piezoresistive gauges. As a variant the means of detection comprise piezoelectric gauges. Again as a variant, the means of detection comprise one or more resonating beams. For this, an electrode is disposed in such a way as to create an electrostatic force on the gauge so as to put it into resonance. The variation in the resonance frequency of the gauge due to the stress is measured by means of a specific circuit that can be a phase-locked loop.

It will be understood that the arrangements of the bending elements in relation to the bending beams and/or in relation to the means of detection can vary.

In the examples described and advantageously, the axis of rotation Y1 passes through the middle of the bending beams. However a hinge wherein the axis of rotation Y1 would not pass through the middle of the bending beams belongs to the scope of the present invention, the hinge would then have a greater out-of-plane stiffness.

As a variant, the bending beams are offset with respect to one another in the plane in the direction X, i.e. the centres thereof are not aligned on the axis Y1. The hinge then has an increased stiffness in bending.

Figure 5:
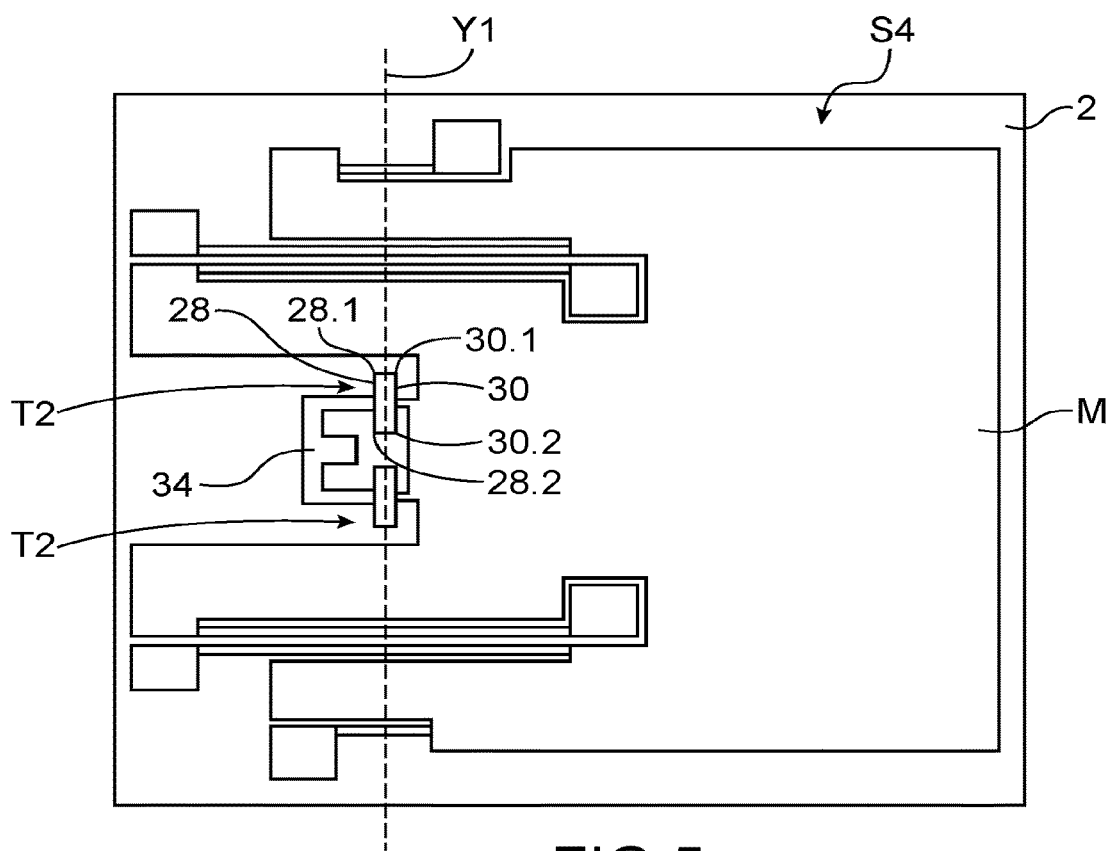
FIG. 5 is a top view of another embodiment of a structure that comprises torsion elements.

FIG. 5 shows a structure S4 comprising a hinge wherein the torsion function is carried out advantageously by the torsion elements, providing a releasing of the stress forces, and therefore having little or no effect on the movable part.

Indeed, the torsion beams are made in the same layer as the torsion elements and are therefore also the seat of internal stresses that will be relaxed during the release of the suspended structure. This relaxing can for example be caused by a buckling of the beams.

The torsion elements T2 comprise at least one pair of torsion beams mechanically connected together in series.

The two torsion elements have similar structures, only one of the torsion elements T2 will be described in detail.

The torsion element T2 comprises a pair of torsion beams 28, 30 disposed parallel with each other and disposed symmetrically in relation to the axis of rotation Y1 in such a way that their combined actions effectively define the axis of rotation Y1.

The two torsion beams are directly connected to each other by the longitudinal ends thereof 28.1, 30.1 and 28.2, 30.2 respectively in such a way as to form a rectangle. The connection between the longitudinal ends 28.1, 30.1 and the connection between the longitudinal ends 28.1, 30.2 are rigid with respect to the beams 28, 30. Moreover the bending beam 28 is directly connected to the support via an anchoring stud 34, for example at the middle thereof, and the bending beam 30 is directly connected to the movable part, for example at the middle thereof.

The ends 28.1, 30.1, 28.2, 30.2 of the beams 28, 30 are free to be displaced, allowing the stresses internal to the torsion beams 28, 30 to be released. As the stresses of 28 and 30 are very close, the ends thereof 28.1, 30.1 and 28.2, 30.2 will be displaced substantially identically and the rigid connection between them does not hinder the releasing of the stresses.

The internal stresses are then not applied on the movable part. Each torsion assembly manages its own internal stresses.

As a variant, the torsion beams 28 and 30 are connected only by one of the ends thereof, for example by the ends 28.2 and 30.2, and the ends 28.1 and 30.1 correspond to the fastening to the anchoring stud 34 and to the movable part respectively.

The structures described hereinabove comprise advantageously at least one lower abutment and/or at least one upper abutment in order to limit the amplitude of out-of-plane displacement of the movable part and to prevent damage to the structure, for example when an external impact is applied to the structure. The abutments are of the type well known to those skilled in the art.

In the case where the structure is used to produce an actuator, means for displacing in the out-of-plane direction the movable part are provided, for example this is electrostatic means.

Furthermore the integration of the bending elements, of the bending beams or bending elements in the movable part can be more or less substantial according to the space available and/or the mass required for the movable part, which makes it possible to offer a large number of structure configurations that can be adapted to many applications.

Thanks to the invention the position of the movable part in relation to the substrate is known and is not modified during the release of the movable part.

The structure can be produced by conventional techniques of microelectronics, without adding any complex step, for example the embodiment described in document EP2211185 can be implemented.

An example embodiment shall be described hereinbelow.

Figure 6A:
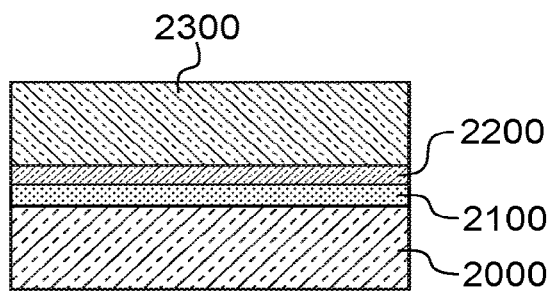
FIGS. 6A, 6B and 6C diagrammatically show steps of an example of a method for producing a structure according to the invention.
Figure 6B:
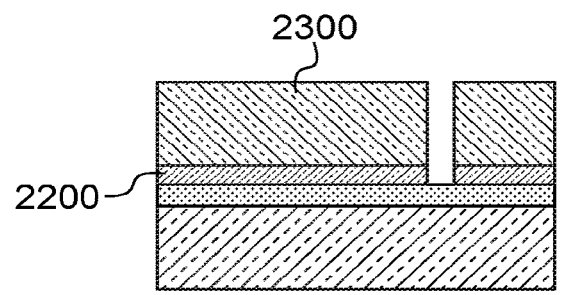
Figure 6C:
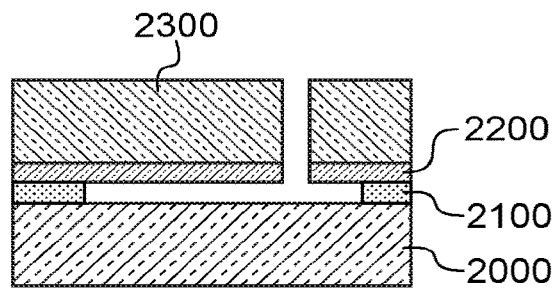

For example, from a Silicon On Insulator (SOI) substrate, comprising a layer 2000 of silicon, a layer 2100 of silicon oxide and a layer 2200 of monocrystalline silicon, the method comprises:
- a step of forming a layer of monocrystalline silicon 2300 for example by epitaxial deposition of silicon on the layer 2200 (FIG. 6A),
- a step of structuring layers 2200 and 2300 by photolithography and etching in order to delimit the movable part, the gauge or gauges, and the hinge comprising the bending beam or beams and the bending element or elements (FIG. 6B). For example the gauges are produced solely in the layer 2200. In this case, prior to the formation of the layer 2300, the structuring of the layer 2200 in order to form the gauge or gauges is carried out, for example by etching, and the protection of the gauge or gauges for example by the forming and structuring of an oxide layer. The bending elements are produced in the layer 2200 and a portion of the layer 2300 and the torsion beams are produced in the layer 2200 and in the entire thickness of the layer 2300, and
- a step of releasing the movable part and the hinge by etching of the layer 2100 for example by means of hydrofluoric acid (FIG. 6C).

During the deposition of the layer 2300, stresses in compression can be generated in the latter, in particular in case of doping. The implantation of dopant in the layer 2200 can also generate stresses in this lower layer.

Thanks to the invention, during the release of the movable part the releasing of the stresses internal to the layer 2300 does not cause any inclination of the movable part but the latter substantially retains its position in the means plane of the structure.

The hinges according to the invention are particularly adapted to the production of structures for the M&NEMS systems used in producing sensors or actuators.

The invention claimed is:

1. A hinge for a micromechanical and/or nanomechanical structure comprising a support, at least one movable part in an out-of-plane direction with respect to the support, said hinge being configured to suspend the movable part from the support allowing for out-of-plane displacement of the movable part, comprising
- at least one torsion element comprising at least one beam aligned with or parallel to an axis of rotation of the hinge, and configured to be deformed in torsion, and
- at least one bending element configured to be deformed in bending, said bending element being configured to mechanically connect the movable part and the support and comprising at least one first bending beam and at least one second bending beam extending perpendicularly to the axis of rotation of the hinge, the first bending beam being configured to be mechanically connected directly to the support by a first end and to the movable part by a second end, and the second bending beam being configured to be mechanically connected directly to the support by a first end and to the movable part by a second end,
- wherein the first end and the second end of the first bending beam and the first end and the second end of the second bending beam are disposed with respect to one another in such a way that a first orientation of the first end towards the second end of the first bending beam is opposite to a second orientation of the first end towards the second end of the second bending beam,
- wherein the first bending beam is configured to have an internal stress in the first orientation and the second bending beam is configured to have an internal stress in the second orientation, and
- wherein the first end and the second end of the first bending beam are located on each side of the axis of rotation and the first end and the second end of the second bending beam are located on each side of the axis of rotation.

2. The hinge according to claim 1, wherein the at least one first and second bending beams have the same dimensions.

3. The hinge according to claim 1, comprising two bending elements.

4. The hinge according to claim 3, wherein the bending elements are disposed on either side of the at least one torsion element.

5. The hinge according to claim 1, comprising two torsion elements each comprising a torsion beam aligned with the axis of rotation.

6. The hinge according to claim 1, wherein the torsion element comprises a first torsion beam and a second torsion beam, the first and second torsion beams being parallel to one another and connected together by at least one of longitudinal ends thereof, one of the first and second torsion beams being configured to be mechanically connected directly to the movable part and the other of the first and second torsion beams being configured to be mechanically connected directed to the support.

7. The hinge according to claim 6, comprising two pairs of torsion beams aligned relative to each other along the axis of rotation.

8. The hinge according to claim 1, comprising a stack of layers partly etched, wherein at least the first and second bending beams are made in the same layer.

9. A micromechanical and/or nanomechanical structure comprising a support, a movable part in the out-of-plane direction with respect to the support and a hinge according to claim 1 connecting the movable part to the support.

10. The structure according to claim 9, comprising at least one out-of-plane abutment for the movable part moving away from and/or moving towards the support.

11. A micromechanical system comprising at least one structure according to claim 9.

12. The micromechanical system according to claim 11, comprising at least one sensor for detecting the out-of-plane displacement of the movable part, comprising at least one first stress gauge, the first stress gauge being mechanically connected directly to the support by a first end and to the movable part by a second end.

13. The micromechanical system according to claim 12, wherein the at least one sensor further comprises a second stress gauge, the second stress gauge being mechanically connected directly to the support by a first end and to the movable part by a second end, the first end and the second end of the first stress gauge and the first end and the second end of the second stress gauge being disposed with respect to one another in such a way that an orientation of the first end towards the second end of the first stress gauge is opposite to an orientation of the first end towards the second end of the second stress gauge.

14. The hinge according to claim 1, wherein the internal stress of the first bending beam is substantially equal to the internal stress of the second bending beam.

15. The hinge according to claim 1, wherein the first and second bending beams are configured such that the respective internal stresses produce opposite stresses on the at least one movable part.

16. A hinge for a micromechanical and/or nanomechanical structure comprising a support, at least one movable part in an out-of-plane direction with respect to the support, said hinge being configured to suspend the movable part from the support allowing for out-of-plane displacement of the movable part, comprising
- at least one torsion element comprising at least one beam aligned with or parallel to an axis of rotation of the hinge, and configured to be deformed in torsion, and
- at least one bending element configured to be deformed in bending, said bending element being configured to mechanically connect the movable part and the support and comprising at least one first bending beam and at least one second bending beam extending perpendicularly to the axis of rotation of the hinge, the first bending beam being configured to be mechanically connected directly to the support by a first end and to the movable part by a second end, and the second bending beam being configured to be mechanically connected directly to the support by a first end and to the movable part by a second end,
- wherein the first end and the second end of the first bending beam and the first end and the second end of the second bending beam are disposed with respect to one another in such a way that a first orientation of the first end towards the second end of the first bending beam is opposite to a second orientation of the first end towards the second end of the second bending beam,
- wherein the first bending beam is configured to have an internal stress which is exerted on the movable part in the first orientation and the second bending beam is configured to have an internal stress which is exerted on the movable part in the second orientation, and
- wherein the first end and the second end of the first bending beam are located on each side of the axis of rotation and the first end and the second end of the second bending beam are located on each side of the axis of rotation.

* * * * *